United States Patent
Roddy et al.

(10) Patent No.: US 6,347,107 B1
(45) Date of Patent: Feb. 12, 2002

(54) SYSTEM AND METHOD OF IMPROVING INTENSITY CONTROL OF LASER DIODES USING BACK FACET PHOTODIODE

(75) Inventors: James E. Roddy; Nelson A. Blish, both of Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 09/115,748

(22) Filed: Jul. 15, 1998

(51) Int. Cl.[7] .................................................. H01S 5/00
(52) U.S. Cl. ............................................ 372/49; 372/50
(58) Field of Search .............................. 372/33, 36, 38, 372/43, 50, 49

(56) References Cited

U.S. PATENT DOCUMENTS

| | | | |
|---|---|---|---|
| 3,943,462 A | * 3/1976 | Thompson | 372/49 |
| 4,178,564 A | * 12/1979 | Ladany et al. | 372/49 |
| 4,744,088 A | * 5/1988 | Heinen et al. | 372/50 |
| 4,751,710 A | * 6/1988 | Yamaguchi et al. | 372/50 |
| 4,769,342 A | 9/1988 | Yagi et al. | 938/24 |
| 4,989,198 A | 1/1991 | Kojima et al. | 369/116 |
| 5,067,117 A | 11/1991 | Shimizu et al. | 369/116 |
| 5,068,868 A | 11/1991 | Deppe et al. | 372/45 |
| 5,258,991 A | 11/1993 | Peterson | 372/50 |
| 5,363,363 A | 11/1994 | Gage | 369/116 |
| 5,438,208 A | 8/1995 | Takemoto | 250/551 |
| 5,568,502 A | 10/1996 | Hironaka | 372/50 |

FOREIGN PATENT DOCUMENTS

| | | | | |
|---|---|---|---|---|
| JP | 62-012181 A | * | 1/1987 | H01S/3/18 |
| JP | 01-129486 A | * | 5/1989 | H01S/3/18 |

* cited by examiner

*Primary Examiner*—Quyen Leung
(74) *Attorney, Agent, or Firm*—David A. Novais; Nelson Adrian Blish (57) ABSTRACT

A system and method of controlling laser power output levels includes a laser (9) and a control circuit (27) for energizing the laser. A sensor (11) that measures power output from a back facet of a laser element (17) of the laser provides feedback to the control circuit so as to maintain power output from the laser constant. The back facet of the laser element is covered with a coating that has transmission and reflection characteristics that are relatively insensitive to minor changes in the wavelength of the laser. The coating is preferably a thin metallic layer which provides a constant and adequate reflectivity and low transmittance. With the specific metallic layer on the back facet, the transmittance remains relatively consistent even when there is a change in wavelength. This provides for consistent readings at the sensor.

23 Claims, 6 Drawing Sheets

FIG. 6 PERFORMANCE OF A SILVER MIRROR vs. THICKNESS

SYSTEM AND METHOD OF IMPROVING INTENSITY CONTROL OF LASER DIODES USING BACK FACET PHOTODIODE

FIELD OF THE INVENTION

The present invention relates in general to the field of lasers, and specifically to laser diodes that contain an integral photodiode for monitoring and controlling laser intensity.

BACKGROUND OF THE INVENTION

Laser diodes have been manufactured for years and most contain a silicon photodiode inside a laser can. This photodiode (PD) is used to monitor the power of the laser and can be connected to a feedback circuit to coarsely control the laser intensity as the laser heats up.

Figure 1:
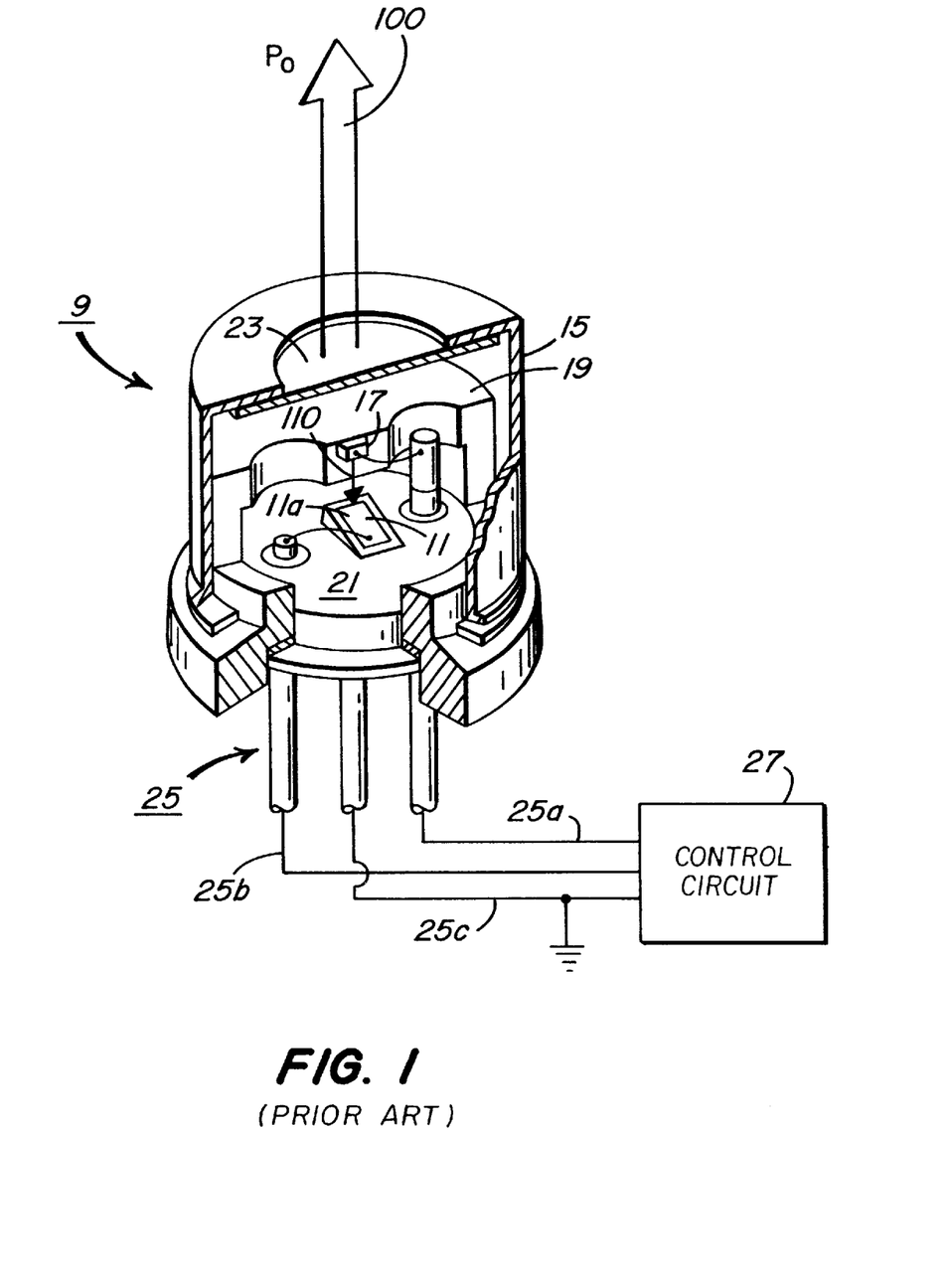
FIG. 1 illustrates a semi-conductor laser which is applicable to the present invention.

FIG. 1 shows a semiconductor laser or laser diode 9 with a monitor photodiode 11 inside a sealed can defined by a cap 15. Monitor photodiode 11 is attached to a stem 21. A semiconductor laser element or laser chip 17 is mounted on a heat sink 19, which is attached to stem 21. This configuration is covered by a container or cap 15, which has window 23 which allows passage of laser light.

As also shown in FIG. 1, semiconductor laser 9 includes a terminal 25 which provides a connection to a control circuit 27. Terminal 25 includes a first line 25a which leads to laser element 17, a second line 25b which leads to sensor or photodiode 11, and a third line 25c which is a ground wire. Control circuit 27 energizes semiconductor laser element 17 in a known manner so as to emit a laser beam 100 with a light power output $P_0$ through window 23. As further illustrated in FIG. 1, photodiode 11 is fixed to stem 21 with its light receiving surface 11a facing laser element 17. Laser beam 100 with light power output $P_0$ is emitted from laser element 17 through window 23 and at the same time, a monitor beam 110 with a light power output of about 3% of $P_0$ is emitted from laser element 17 toward photodiode 11. Monitor beam 110 incident on the monitor photodiode 11 generates a monitor signal. This monitor signal is fed back to control circuit 27 for driving laser element 17 so that the power output $P_0$ of the laser beam 100 emitted from the laser element 17 is maintained in a stable state. A typical example of a control circuit as described above is shown in, for example, U.S. Pat. No. 5,067,117.

In early designs, laser diodes were made in a wafer and laser elements 17 were scribed and cleaved to form front and back facets. These facets were not coated but had a reflectivity of 30% to 35% because of the high index of the semiconductor (GaAs, AlGaAs) material. This reflectivity was sufficient to attain a round trip gain of greater than unity to establish laser action. A problem with this design is that half of the light came out the front facet of the laser element, and the other half came out the back to strike the photodiode. An example of such a laser is the Hitachi 8312. In such a laser, the photodiode output appeared to track reasonably well with the laser output and a measurement of photodiode current vs. laser power was very linear.

Figure 2:
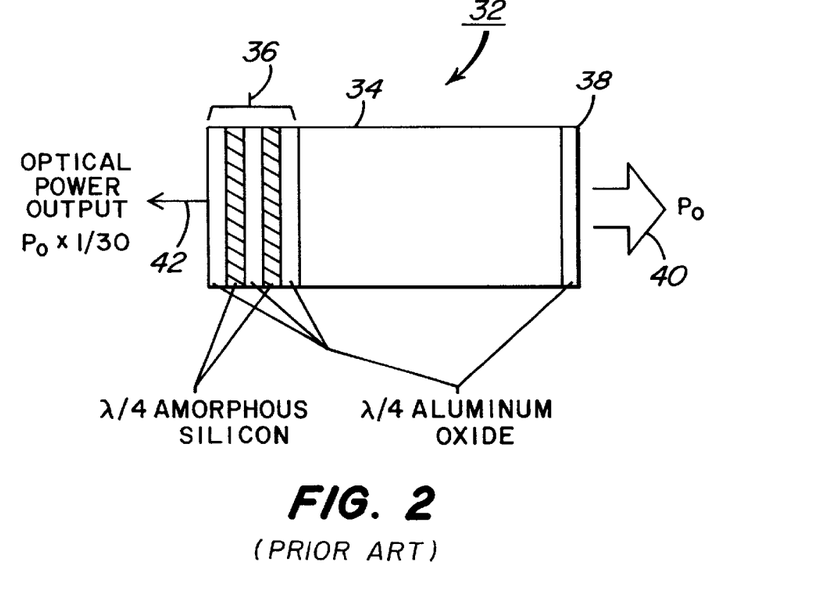
FIG. 2 is a detailed view of a laser element or chip structure including the front and back facets of the laser element.

In an effort to provide more power, laser manufacturers started to introduce lasers with dielectric mirrors on the back facet and modest anti-reflection (AR) coatings on the front facet. The mirror directed most of the light out the front of the laser, while allowing a small amount to leak through the back facet to the photodiode which was used to monitor and control laser power. FIG. 2 shows a conventional laser element or laser chip design 32 with a multilayer mirror on the back facet. The structure of FIG. 2 comprises a laser element 34 with a rear facet multilayer mirror 36 comprised of alternating amorphous silicon and aluminum oxide layers; and a front facet AR (aluminum oxide) coating 38. A rated laser power $P_0$ (40), is emitted from the front facet, and a small fraction, $P_0/30$ (42) is emitted from the rear facet to the photodiode.

The Hitachi 8314 laser has basically the same structure as the Hitachi 8312 laser, except that a multilayer mirror and an AR coating were applied as shown in FIG. 2. The output power available was effectively doubled, but a measurement of photodiode current vs. laser power showed some non-linearity even if the laser stayed in a single longitudinal mode. This led to problems with respect to the photodiode current not being well correlated to the laser front facet power. At times it would be well correlated, and then behave erratically and unpredictably. In order to achieve a tight control of laser power, some laser arrangements included a complicated means of sampling the front facet beam with a prism or window to provide a well correlated signal for power control (see, for example, U.S. Pat. Nos. 5,067,117, 4,989,198, and 5,363,363).

Conventional multilayer periodic mirror systems are made of quarter wave thick layers of alternating high index and low index films. Versions of this structure are used by laser manufacturers to make high reflectivity mirrors for the back facet of the laser as shown in FIG. 2. Such structures can be fairly uniform in reflectivity for a large range of wavelengths. However, it is the transmittance of coherent light in such structures that is the cause of the erratic behavior of the back facet photodiode output. When the laser heats up causing mode drift or mode hops, the wavelength changes, slowly and predictably in the first case and rapidly and erratically in the second case. When the laser is mode hopping, the correlation between the laser power and the photodiode current tends to be poor.

Figure 3:
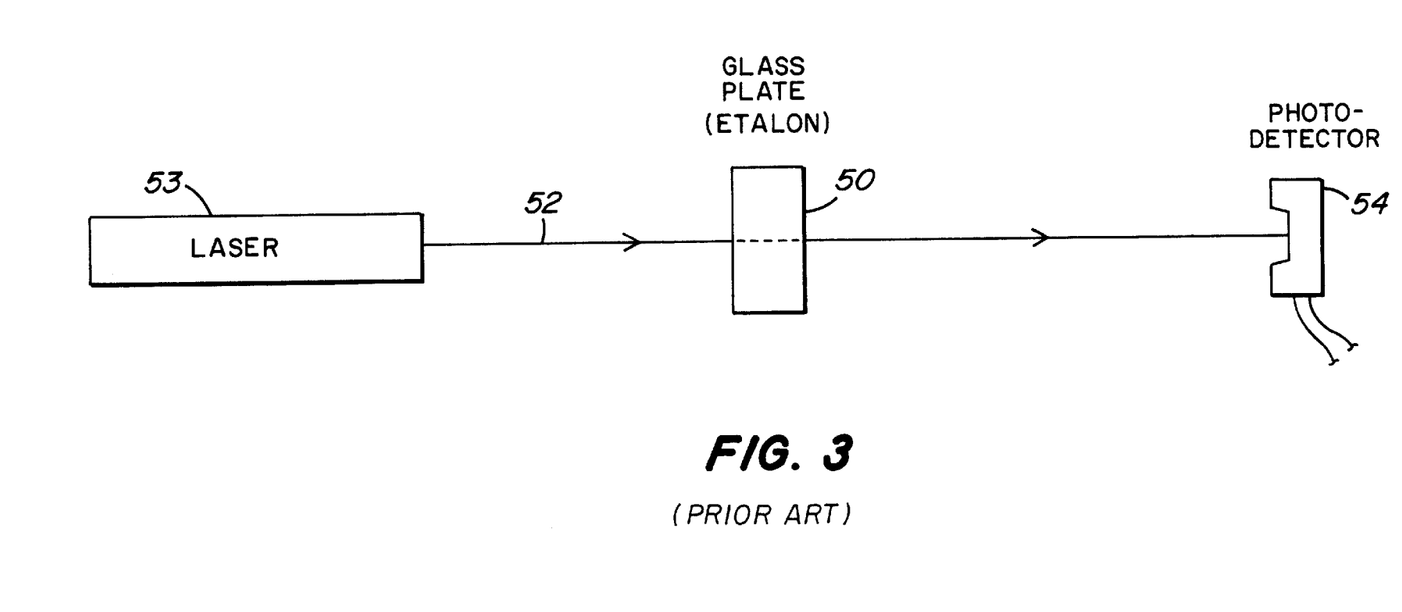
FIG. 3 is a schematic view of a laser system having a glass plate in a path of a laser beam to illustrate a Fabry-Perot effect.

A back facet mirror made up of multiple quarter wavelength layers as described above can act as a Fabry-Perot etalon or an optical bandpass filter. The undesirable Fabry-Perot effect of the multilayer mirror can be better understood by examining the effect of a more typical Fabry-Perot etalon such as a glass plate. FIG. 3 shows such an etalon which is basically a parallel plane glass plate 50 in a path of a laser beam 52 emitted by a laser 53. Laser beam 52 passes through glass plate 50 and strikes a photodetector 54. The power transmitted by glass plate 50 and measured by detector 54 is a function of the wavelength of laser 53, due to constructive and destructive interference within the glass plate 50 from reflections from the two surfaces of glass plate 50.

Figure 4:
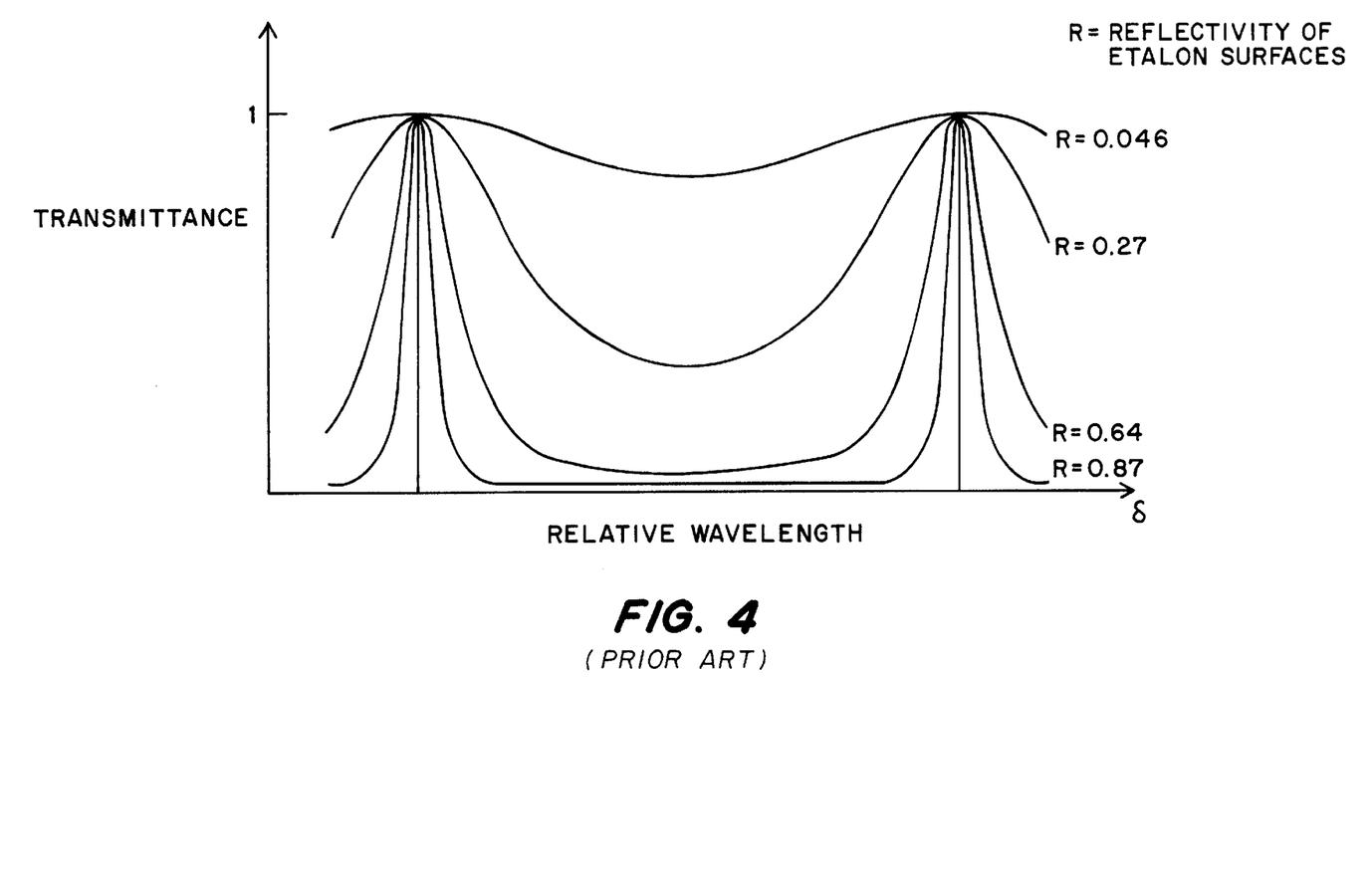
FIG. 4 is a graph of relative wavelength versus transmittance through the glass plate of FIG. 3.

FIG. 4 illustrates a graph which shows the transmittance of glass plate 50 as a function of the wavelength and as a function of the reflectivity of the two surfaces of glass plate 50, and is effectively the light level at detector 54 of FIG. 3. As the reflectivity of the surfaces of glass plate 50 increases, the transmitted peaks narrow and the variation between the maximum and minimum level of light transmitted increases. In other words, the Fabry-Perot effect increases with reflectivity. Even a low reflectivity of about 4% has a noticeable effect. As the laser mode hops and changes wavelength, the light transmitted through the back facet mirror can vary even though the laser output from the front facet remains constant. There are three approaches to decrease the Fabry-Perot effect: (1) decrease the reflectivity of the surfaces of the glass plate, (2) add neutral density between the two surfaces of the glass plate to reduce the interference, and (3) tilt the glass plate in the beam such that the transmitted beam and the reflected beam do not overlap each other. In a laser diode, the last two approaches (2 and 3) are not easy to implement. The first approach (1) which may involve decreasing the reflectivity to as low as 4% will still not eliminate the Fabry-Perot effect, but it will inhibit the laser from lasing. Thus, the original cleaved, uncoated facet is preferable to a low reflectivity multilayer mirror.

In view of the above discussion, it can now be seen why the back facet diode current sometimes tracks the laser output very well and sometimes behaves very erratically. As the laser changes wavelength, the light transmitted to the back facet photodiode can vary substantially even though the laser output power has not changed.

For product designs where the back facet photodiode provides inadequate control, complicated front facet pickoff methods such as shown in U.S. Pat. No. 5,067,117 appear to be the typical solution. Methods of fabricating lasers to provide a monolithic photodiode are described in U.S. Pat. Nos. 5,258,991; 5,568,502; 4,769,342; and 5,438,208. Such monolithic detectors are directed at fabricating the detector at the same time as the laser, thereby reducing time consuming and costly assembly of the photodetector inside the laser can. U.S. Pat. No. 5,068,868 shows a front facet metallic mirror and a dielectric back facet mirror. In U.S. Pat. No. 5,068,868, no mention is made of a photodiode to monitor the power of the laser. Also, a typical monitor photodiode is difficult to implement in a vertical cavity laser due to its structure.

SUMMARY OF THE INVENTION

The present invention provides for a novel system, method and semi-conductor laser which overcome the drawbacks noted above. The system, method and semi-conductor laser of the present invention include a monitor photodiode that monitors and controls laser intensity. A laser element or laser chip of the laser of the present invention includes a back facet that comprises a metallic coating. The metallic coating overcomes the drawbacks of dielectric mirror surfaces and permits sufficient transmittance and constant reflectivity. This provides for an adequate signal to the monitor photodiode, and at the same time provides for an adequate and uniform reflectivity so as to maintain constant laser power output levels.

The present invention relates to a system for controlling laser power output levels which comprises a laser; a control circuit for energizing the laser; and a sensor for measuring a laser power output from a back facet of the laser. The sensor provides feedback to the control circuit for maintaining laser power output levels. The back facet of the laser is covered with a coating and transmission and reflection characteristics of the coating are relatively insensitive to minor changes in wavelength of the laser.

The present invention further relates to a method of controlling laser power output levels which comprises the steps of forming front and back facets on a laser element of a laser; covering the back facet of the laser element with a coating having transmission and reflection characteristics that are relatively insensitive to minor changes in wavelength of the laser; and positioning the laser element on the laser so that the back facet faces a sensor on the laser. The sensor measures power output from the back facet.

The present invention also relates to a laser which comprises a container having an aperture; a laser element positioned in the container and having front and back facets, with the front facet of the laser element facing the aperture; and a sensor having a light receiving surface which faces the back facet of the laser element. The sensor measures a power output from the back facet of the laser element. The back facet is covered with a coating layer having transmission and reflection characteristics which are relatively insensitive to minor changes in wavelength of the laser.

DETAILED DESCRIPTION OF THE INVENTION

The present invention provides for a system, method and apparatus which eliminates the adverse Fabry-Perot effect on lasers which tends to cause erratic back facet diode currents. It is desirable to have a back facet mirror on a laser and to have sufficient light transmitted through this mirror for the monitor photodiode. Typically, for red and near infrared lasers of reasonable power, between 1% and 10% of the laser light transmitted through the back facet mirror is sufficient because of the high responsivity of silicon at these wavelengths.

Figure 5A:
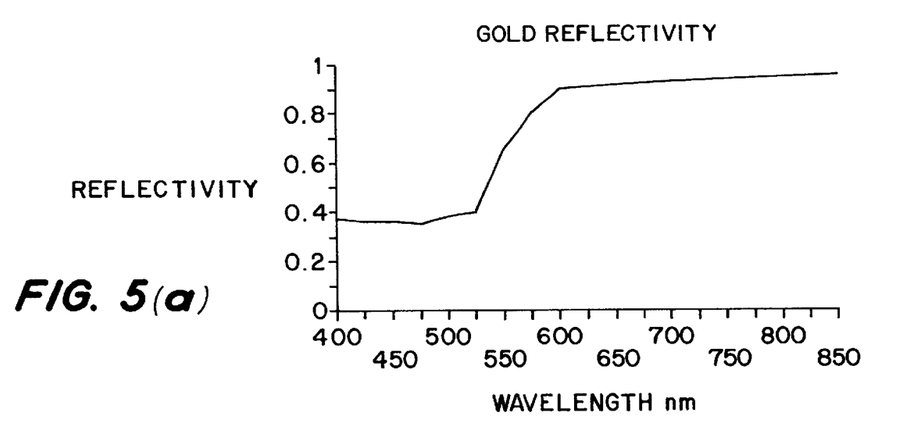
FIGS. 5(a)–5(c) are graphs respectively illustrating the reflectivity of gold, silver and aluminum versus wavelength.
Figure 5B:
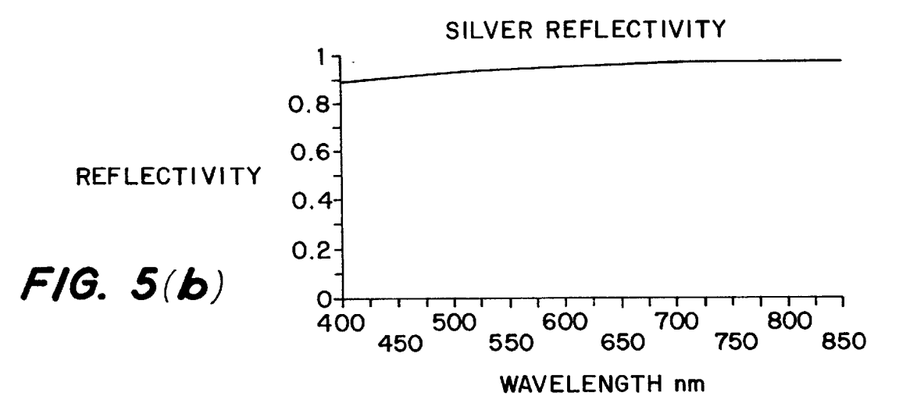
Figure 5C:
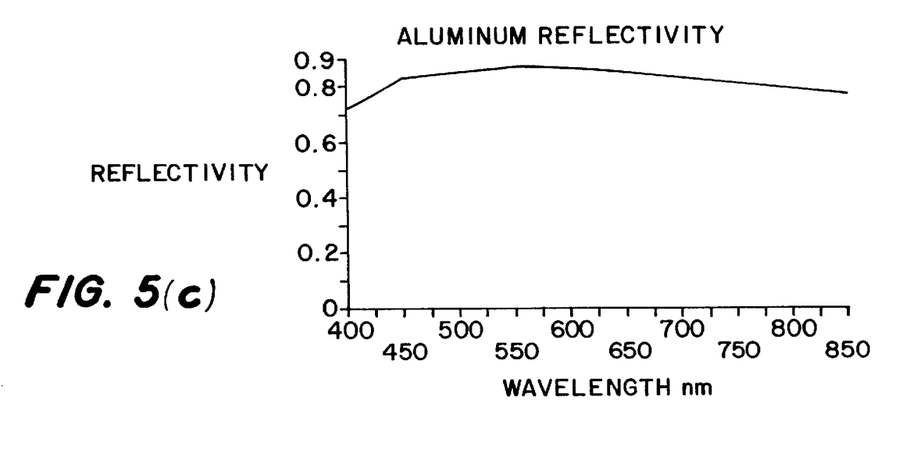

In the field of optics it is known to use mirrors made of metallic films. Metals offer high reflectivity and are easy to coat in thin layers. FIGS. 5(a), 5(b), and 5(c) show the reflectivity of gold, silver, and aluminum, respectively, with wavelength. All three are common in optical and electronic processes. As shown in FIG. 5(a), gold is not as reflective at shorter visible wavelengths as silver and aluminum, but it has the advantage of stability since it does not form an oxide. A hermetically sealed laser allows silver and aluminum to be coated and sealed without significant loss due to oxidation, however, the choice of metals is more likely to be determined by compatibility with the laser fabrication process which varies with laser type and manufacturer.

Figure 6:
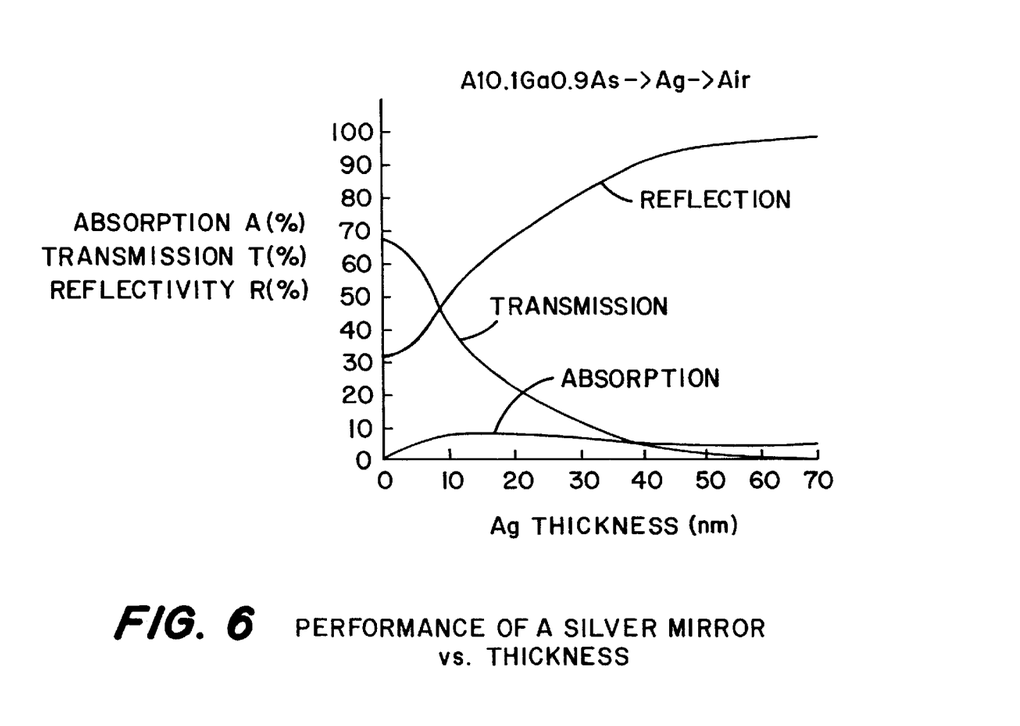
FIG. 6 is a graph which illustrates the reflectivity, transmittance, and absorption of a silver mirror for a range of metal thicknesses.

In metallic mirrors there is a small but noticeable amount of absorption of the transmitted beam. However, thin coatings of metallic mirrors much thinner than 1 $\mu$m) can provide sufficient transmittance to allow adequate signal to noise for the photodiode signal. FIG. 6 illustrates known properties of reflectivity, transmittance, and absorption of a silver mirror on an AlGaAs substrate for a range of metal thicknesses. From FIG. 6 it can be seen that a thickness range of 10 to 60 nm provides adequate reflectivity (50 to 95%) and a transmittance in the range of 40% to 1%.

Figure 7A:
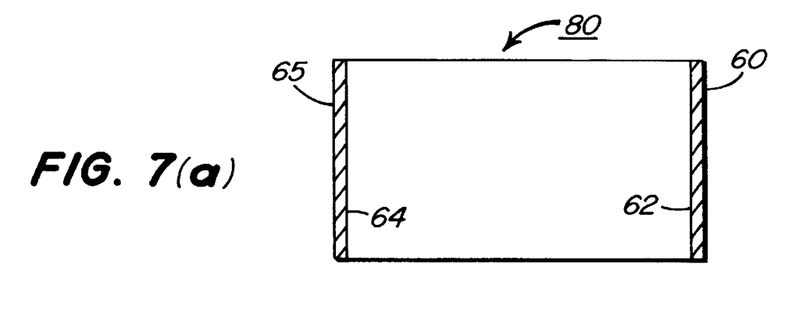
FIGS. 7(a)–7(c) respectively illustrate configurations of a laser element with a metallic back facet mirror in accordance with the present invention.
Figure 7B:
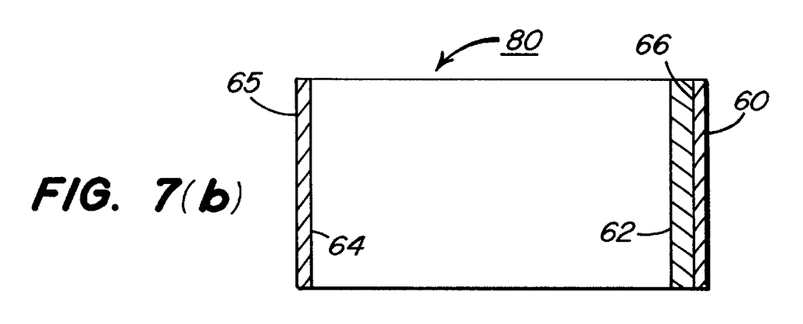
Figure 7C:
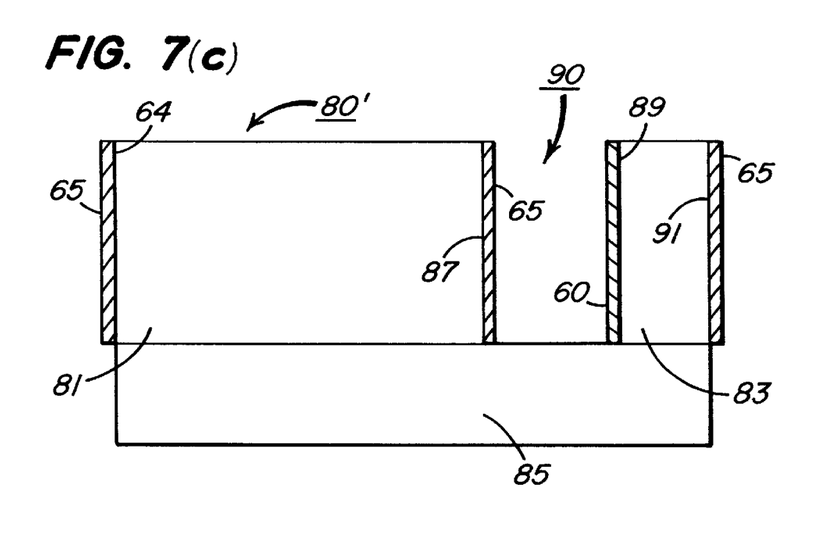

FIGS. 7(a)–7(c) respectively illustrate three configurations of a laser element or chip in accordance with the present invention. In FIG. 7(a), laser element 80 includes a metallic back facet mirror coating 60 which is deposited directly on back facet 62 of laser element 80. An anti-reflective (AR) coating 65 is deposited on front facet 64 of laser element 80. Metallic back facet mirror coating 60 can be in the form of a single layer of any suitable metal, however, an approximately 40 nanometer thick silver coating is near optimum (see graph of FIG. 6). This provides for a coating on back facet 62 which has reflection and transmission characteristics that are relatively insensitive to minor changes in wavelength of the laser. AR coating 65 can be a quarter wavelength thickness of aluminum oxide for an AlGaAs laser, but any suitable process compatible material can be used. In a preferred embodiment, a passivation coating is applied to both front and back facets 64, 62 to prevent defects and prolong lifetime. However, AR coating 65 on the front facet can perform this function in the area of the front facet. The passivation coating may also be desirable to prevent the metallic back facet mirror from contaminating (doping) the laser material.

As shown in the embodiment of FIG. 7(b), a dielectric coating 66 can be applied to back facet 62 before depositing the metallic back facet mirror coating 60. Ideally, dielectric coating 66 is the same index as the laser material, but if the thickness is kept to the order of a quarter wavelength, then the index is not critical.

A third embodiment is shown in FIG. 7(c) where an extension from a body of a laser in the form of an integral or separate structure is shown. The extension which has a surface that is parallel to an end surface of the body is used as a mirror, and is grown in a known manner on the same substrate as the laser. As illustrated in FIG. 7(c), laser element 80 includes a first member 81, a second member 83 and a third member 85 which connects first member 81 and second member 83. Second member 83 and third member 85 form the extension. First member 81 comprises front facet 64 and a first rear surface 87. Second member 83 comprises a forward surface 89 which faces first rear surface 87 and is parallel to first rear surface 87. There is also a gap 90 between first rear surface 87 and forward surface 89. As also shown in FIG. 7(c), second member 83 comprises a second rear surface 91. Fabrication of a structure as shown in FIG. 7(c) is known in the semiconductor laser industry. As an example, reference is made to U.S. Pat. Nos. 4,769,342; 5,258,991; 5,438,208; and 5,568,502.

As illustrated in FIG. 7(c), in the present invention surfaces 64, 87 and 91 each have an anti-reflection coating 65 applied thereon; also, metallic mirror coating 60 is deposited on forward surface 89. With this structure, metallic mirror coating 60 is deposited on forward surface 89 so as to face first member 81 with gap 90 therebetween. Gap 90 should be sized to as to avoid any interference effects. This structure minimizes the possibility of contaminating the laser structure or causing a possible short between laser electrodes.

The invention has been described in detail with particular reference to certain preferred embodiments thereof, but it will be understood that variations and modifications can be effected within the spirit and scope of the invention.

What is claimed is:

1. A system for controlling laser power output levels, the system comprising:
    a laser;
    a control circuit for energizing said laser;
    a sensor for measuring a laser power output from a back facet of said laser, said sensor providing feedback to said control circuit for maintaining laser power output levels from said laser constant;
    wherein the back facet of said laser is covered with a coating, wherein reflection and transmission characteristics of said coating are insensitive to changes in wavelength of said laser; and
    wherein said coating is a metallic layer.

2. A system as claimed in claim 1, wherein said layer is silver.

3. A system as claimed in claim 1, wherein said layer has a thickness of approximately 40 nanometers.

4. A system as claimed in claim 1, wherein said layer is gold.

5. A system as claimed in claim 1, wherein said layer is aluminum.

6. A system as claimed in claim 1, wherein a layer of dielectric material is located between said layer of metal and said laser.

7. A method of controlling laser power output levels, the method comprising the steps of:
    forming front and back facets on a laser element of a laser;
    covering said back facet of said laser element with a coating having transmission and reflection characteristics which are insensitive to changes in wavelength of said laser;
    positioning said laser element on said laser so that said back facet faces a sensor on said laser, said sensor measuring power output from said back facet; and
    wherein said coating is a metallic layer which forms a metallic mirror on said back facet.

8. A method according to claim 7, wherein said metallic layer is selected from a group comprising of silver, gold or aluminum.

9. A method according to claim 7, comprising the further step of depositing a single layer dielectric coating on said back facet prior to said step of covering said back facet with said coating.

10. A method according to claim 7, comprising the further step of providing a control circuit for energizing said laser, wherein said sensor measures a power output from the back facet of said laser and provides feedback to said control circuit for maintaining a power output from said laser constant.

11. A method according to claim 7, wherein said coating has a thickness of approximately 40 nanometers.

12. A laser comprising:
    a container having aperture;
    a laser element positioned in said container and having front and back facets, said front facet of said laser element facing said aperture;
    a sensor having a light receiving surface which faces the back facet of the laser element, said sensor measuring a power output from the back facet of said laser element;
    wherein said back facet is covered with a coating layer having reflection and transmission characteristics which are insensitive to changes in wavelength of said laser; and
    wherein said coating layer is a metallic layer.

13. A laser according to claim 12, wherein said metallic layer is one of silver, gold or aluminum.

14. A laser according to claim 12, wherein said coating has a thickness of approximately 40 nanometers.

15. A laser according to claim 12, wherein a single layer dielectric coating is deposited on said back facet and said coating layer is provided on said dielectric coating.

16. A laser comprising:
    a container having aperture;
    a laser element positioned in said container;

a sensor having a light receiving surface which faces said laser element, said sensor measuring a power output from said laser element; and wherein said laser element comprises a first member, a second member and a third member which connects said first member and said second member, said first member comprising a front facet and a first rear surface, and said second member comprising a forward surface which faces said first rear surface, wherein a coating layer having reflection and transmission characteristics which are insensitive to changes in wavelength of said laser element is applied on the forward surface of said second member, said forward surface facing said first rear surface of said first member with a gap therebetween, said second member further comprising a second rear surface.

17. A laser according to claim 16, wherein said anti-reflection coating is provided on said first and second rear surfaces.

18. A system for controlling laser power output levels, the system comprising:
   a laser;
   a control circuit for energizing said laser;
   a sensor for measuring a laser power output from a back facet of said laser, said sensor providing feedback to said control circuit for maintaining laser power output levels from said laser constant; and
   wherein the back facet of said laser is covered with a coating, comprised of a metal layer and a single layer of dielectric wherein reflection and transmission characteristics of said coating are insensitive to changes in wavelength of said laser.

19. A system as claimed in claim 1 wherein said single layer of dielectric has the same index of refraction as said laser.

20. A system for controlling laser power output levels, the system comprising:
   a laser;
   a control circuit for energizing said laser;
   a sensor for measuring power output from a back facet of said laser and providing feedback to said control circuit for maintaining constant power output levels from said laser; and
   a coating on said back facet of said laser that provides uniform reflectivity and transmittance of light at a level detectable by said sensors when said laser changes wavelength, without creating constructive or destructive interference.

21. A system for maintaining laser output power from a laser constant when said laser changes wavelength, said system comprising:
   a control circuit for energizing said laser;
   a sensor, located at a backfacet of said laser, for measuring said laser output power from said back facet of said laser, said sensor providing feedback to said control circuit for maintaining laser output power constant; and
   a coating on said back facet of said laser wherein transmission through said coating does not change when said laser changes wavelength.

22. A system for controlling laser power output levels, the system comprising:
   a laser comprised of a semiconductor material;
   a control circuit for energizing said laser;
   a sensor for measuring a laser power output from a back facet of said laser, said sensor providing feedback to said control circuit for maintaining laser power output levels from said laser constant;
   wherein the back facet of said laser is covered with a coating, wherein reflection and transmission characteristics of said coating are insensitive to changes in wavelength of said laser;
   wherein said coating is composed of a layer of dielectric material and a layer of metal; and
   wherein said layer of dielectric material has an index of refraction equal to the index of refraction of said semiconductor material.

23. A system for controlling laser power output levels, the system comprising:
   a laser comprised of a semiconductor material;
   a control circuit for energizing said laser;
   a sensor for measuring a laser power output from a back facet of said laser, said sensor providing feedback to said control circuit for maintaining laser power output levels from said laser constant;
   wherein the back facet of said laser is covered with a coating, wherein reflection and transmission characteristics of said coating are insensitive to changes in wavelength of said laser;
   wherein said coating is comprised of a layer of dielectric material and a layer of metal;
   wherein an index of refraction of said dielectric material is different from an index of refraction of said semiconductor material; and
   wherein a thickness of said dielectric material is less than a quarter wavelength of said laser.

* * * * *